United States Patent
Kuo et al.

(10) Patent No.: US 12,513,820 B2
(45) Date of Patent: Dec. 30, 2025

(54) FLEXIBLE PRINTED CIRCUIT AND ANTENNA STRUCTURE

(71) Applicant: Wistron NeWeb Corporation, Hsinchu (TW)

(72) Inventors: Li-Kai Kuo, Hsinchu (TW); Ching-Wen Chen, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 329 days.

(21) Appl. No.: 18/190,181

(22) Filed: Mar. 27, 2023

(65) Prior Publication Data
US 2023/0363089 A1  Nov. 9, 2023

(30) Foreign Application Priority Data
May 9, 2022 (TW) .................................. 111117382

(51) Int. Cl.
*H05K 1/03* (2006.01)
*H05K 1/02* (2006.01)

(52) U.S. Cl.
CPC ............. *H05K 1/032* (2013.01); *H05K 1/028* (2013.01); *H05K 2201/0355* (2013.01); *H05K 2201/10098* (2013.01)

(58) Field of Classification Search
None
See application file for complete search history.

(56) References Cited

U.S. PATENT DOCUMENTS

| 8,754,337 B2 | 6/2014 | Kaneda | |
| 2015/0159735 A1* | 6/2015 | Dzafic | B60K 6/48 180/65.23 |
| 2021/0076492 A1* | 3/2021 | Min | H01Q 1/38 |

FOREIGN PATENT DOCUMENTS

| JP | 2016092290 A | * | 5/2016 | |
| KR | 20070012077 A | * | 1/2007 | |
| TW | 201101954 A | | 1/2011 | |
| WO | WO-2022045666 A1 | * | 3/2022 | ........... H05K 1/0266 |

OTHER PUBLICATIONS

JP-2016092290-A (Translation) (Year: 2025).*
WO-2022045666-A1 (Translation) (Year: 2025).*
KR 20070012077 A (Translation) (Year: 2025).*

* cited by examiner

*Primary Examiner* — Timothy J Thompson
*Assistant Examiner* — John B Freal
(74) *Attorney, Agent, or Firm* — McClure, Qualey & Rodack, LLP (57) ABSTRACT

A flexible printed circuit and an antenna structure are provided. The flexible printed circuit has a main body part and a bending part and includes a substrate, two copper foil layers, and two coverlays. The substrate includes a first surface and a second surface, and one surface of each of the two copper foil layers is disposed on the first surface and the second surface of the substrate, respectively. Each of the two coverlays is disposed on another surface of each of the two copper foil layers. Each of the two coverlays includes at least two coverlay holes, and the at least two coverlay holes penetrate through the coverlay and are disposed on the main body part.

19 Claims, 6 Drawing Sheets

FIG. 10B ents. Each of the two coverlays is disposed on
FLEXIBLE PRINTED CIRCUIT AND ANTENNA STRUCTURE

RELATED APPLICATIONS

This application claims priority to Taiwan Application Serial Number 111117382, filed May 9, 2022, which is herein incorporated by reference.

BACKGROUND

Technical Field

The present disclosure relates to a flexible printed circuit and an antenna structure, and more particularly, to a flexible printed circuit and an antenna structure that improve the yield and efficiency of lamination.

Description of Related Art

Flexible printed circuit (FPC) is now being used in a variety of electronic devices because its' bendable, foldable, and twistable characteristics allow it to change shapes according to the space designs of different electronic products, especially wearable devices and handheld devices that are thin and light. Hence, the need for FPC has grown rapidly since the trend of current electronic equipment is petite and light-weight.

Currently, the electronic elements are usually placed on the FPC by surface mounting technology (SMT). However, during the SMT process, warping occurs when the FPC is unevenly heated due to small bubbles inside the cover layer of the FPC, thereby causing the FPC to expand and warp irregularly.

Moreover, FPC can also be used in antenna structures, and to improve electromagnetic wave interference (EMI), a magnetic layer is laminated on the FPC for EMI shielding. However, small bubbles are easily generated during the lamination process, and so the FPC and the magnetic layer are unable to attach nicely, which in turn affects the antenna characteristic In view of this, how to improve warping and fittingness of the FPC during SMT and lamination processes are indeed highly anticipated by the public and become the goal and the direction of relevant industry efforts.

SUMMARY

According to one aspect of the present disclosure, a flexible printed circuit has a main body part and a bending part. The flexible printed circuit includes a substrate, two copper foil layers and two coverlays. The substrate includes a first surface and a second surface. One surface of each of the two copper foil layers is disposed on the first surface and the second surface of the substrate, respectively. Each of the two coverlays is disposed on another surface of each of the two copper foil layers. Each of the two coverlays includes at least two coverlay holes that penetrate through the coverlay and are disposed on the main body part.

According to another aspect of the present disclosure, an antenna structure includes a flexible printed circuit and a magnetic layer. The flexible printed circuit has a main body part and a bending part, and includes a substrate, two copper foil layers, two coverlays and at least two through holes. The substrate includes a first surface and a second surface. One surface of each of the two copper foil layers is disposed on the first surface and the second surface of the substrate, respectively. Each of the two coverlays is disposed on another surface of each of the two copper foil layers. Each of the two coverlays includes at least two coverlay holes that penetrate through the coverlay and are disposed on the main body part. The at least two through holes penetrate through the substrate, the two copper foil layers and the two coverlays. Each of the at least two through holes is correspondingly disposed to one of the at least two coverlay holes in each of the two coverlays, and a diameter of each of the at least two coverlay holes is greater than a diameter of each of the at least two through holes. The magnetic layer is attached to one surface of one of the two coverlays.

According to further another aspect of the present disclosure, an antenna structure includes a flexible printed circuit and a magnetic layer. The flexible printed circuit has a main body part and a bending part, and includes a substrate, two copper foil layers and two coverlays. The substrate includes a first surface and a second surface. One surface of each of the two copper foil layers is disposed on the first surface and the second surface of the substrate, respectively. Each of the two coverlays is disposed on another surface of each of the two copper foil layers. Each of the two coverlays includes at least two coverlay holes that penetrate through the coverlay and are disposed on the main body part. The magnetic layer is attached to one surface of one of the two coverlays and includes at least two pierced holes. Each of the at least two pierced holes penetrates through the magnetic layer and is correspondingly disposed to one of the at least two coverlay holes in each of the two coverlays, and a diameter of each of the at least two coverlay holes is greater than a diameter of each of the at least two pierced holes.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below.

However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
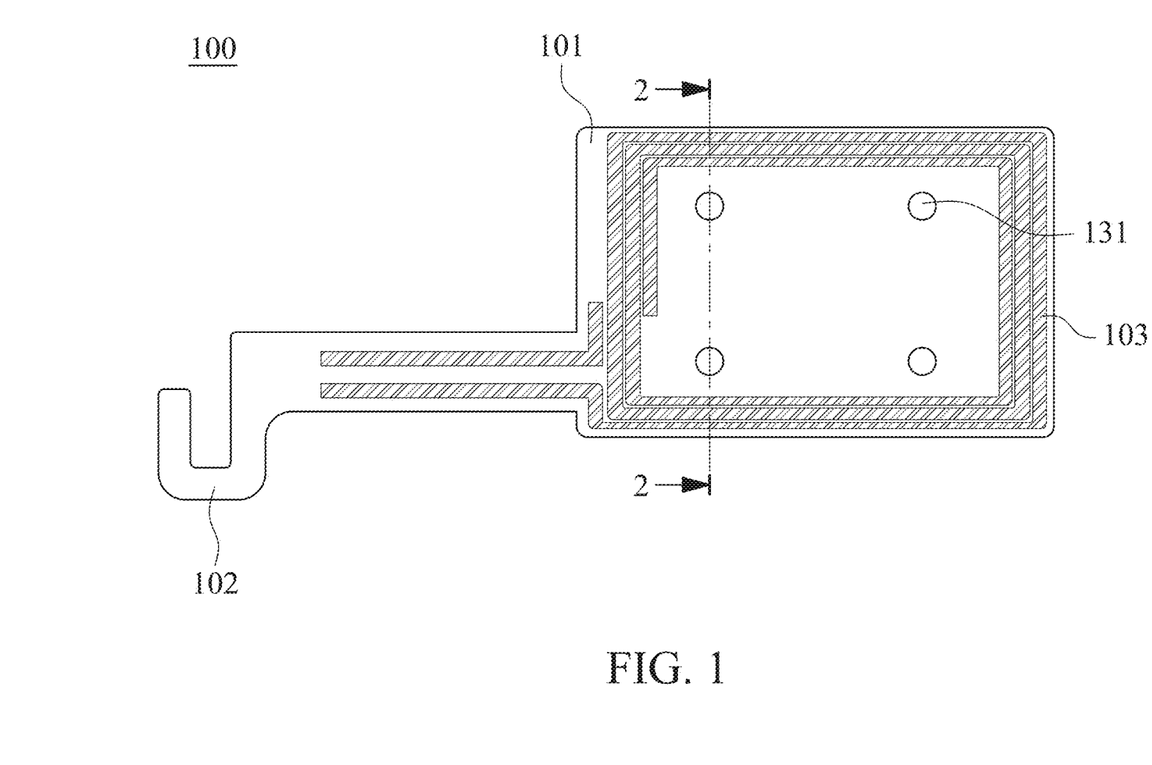
FIG. 1 is a schematic top view of a flexible printed circuit according to one example of one embodiment of the present disclosure.
Figure 2:
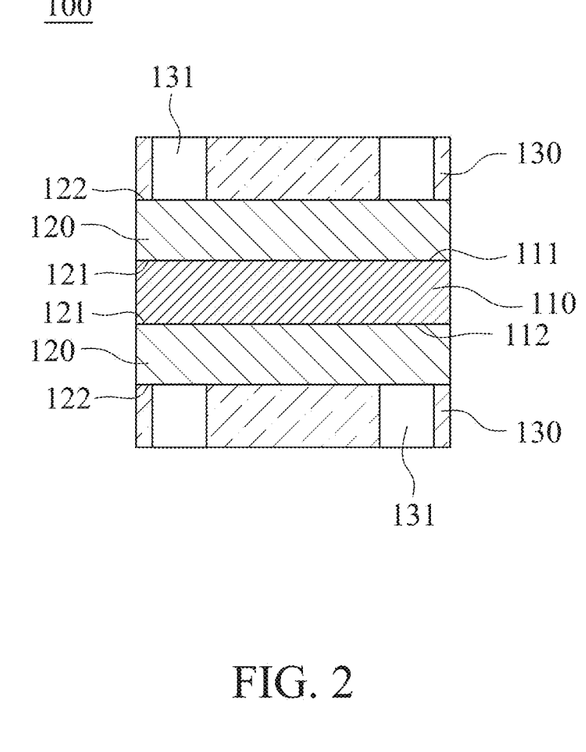
FIG. 2 is a schematic cross-sectional view of the flexible printed circuit along line 2-2 as shown in FIG. 1.

Reference is made to FIG. 1 and FIG. 2, a flexible printed circuit 100 includes a substrate 110, two copper foil layers 120 and two coverlays 130.

The flexible printed circuit 100 has a main body part 101 and a bending part 102. A metal trace 103 is disposed on the surface of the coverlay 130 at the main body part 101 for connecting to an external electronic device and transmitting signals, wherein the metal trace 103 can be in a form of multiple looped coils. The bending part 102 is flexible and is bendable to change shapes. The substrate 110 includes a first surface 111 and a second surface 112. One surface 121 of each of the two copper foil layers 120 is disposed on the first surface 111 and the second surface 112 of the substrate 110, respectively. Each of the two coverlays 130 is disposed on another surface 122 of each of the two copper foil layers 120, and each coverlay 130 includes at least two coverlay holes 131. The coverlay holes 131 penetrate through the coverlay 130 and are disposed inside the metal trace 103 of the main body part 101. Hence, through each of the coverlay holes 131 in each coverlay 130, the warping of the flexible printed circuit 100 caused by uneven heating during SMT process is improved.

In the embodiment shown in FIG. 1 and FIG. 2, the substrate 110 is a polyimide substrate, which has better heat resistance, solder resistance, and size stability. Each copper foil layer 120 is disposed on the substrate 110 by lamination, and each coverlay 130 is an ink layer disposed on each copper foil layer 120 by screen printing, spray printing or film lamination to protect the copper foil layer 120 from being exposed and from affecting subsequent processes.

In addition, the coverlay holes 131 of the coverlay 130 above the substrate 110 and the coverlay holes 131 of the coverlay 130 below the substrate 110 are disposed to correspond in position with one another and to be coaxial, or may not be disposed to correspond nor to be coaxial. The number of the coverlay holes 131 in each coverlay 130 is equal to or greater than two, and a distance between any two of the coverlay holes 131 is at least greater than 2 mm. The diameter of each coverlay hole 131 is equal to or greater than 3 mm. In specific, in the embodiment shown in FIG. 1 and FIG. 2, the coverlay holes 131 of the coverlay 130 above the substrate 110 and the coverlay holes 131 of the coverlay 130 below the substrate 110 are disposed to correspond to one another and to be coaxial, the number of coverlay holes 131 in each coverlay 130 is four, the smallest distance between two coverlay holes 131 is 2 mm, and the diameter of each coverlay hole 131 is 3 mm, but the present disclosure is not limited thereby.

Figure 3:
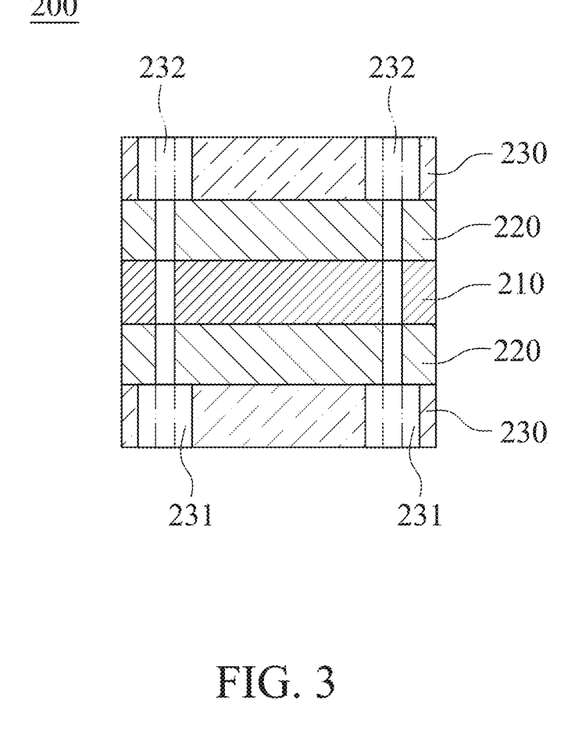
FIG. 3 is a schematic cross-sectional view of a flexible printed circuit according to another example of one embodiment of the present disclosure.

Reference is made to FIG. 3, a flexible printed circuit 200 includes a substrate 210, two copper foil layers 220, two coverlays 230 and at least two through holes 232. The substrate 210, the two copper foil layers 220, the two coverlays 230 with coverlay holes 231 of the flexible printed circuit 200 is similar to the substrate 110, the two copper foil layers 120, the two coverlays 130 with coverlay holes 131 of the flexible printed circuit 100, and will not be described herein. The at least two through holes 232 of the flexible printed circuit 200 penetrate through the substrate 210, the two copper foil layers 220 and the two coverlays 230, and each of the through holes 232 is correspondingly disposed to one of the coverlay holes 231 in each coverlay 230. The diameter of each coverlay hole 231 is greater than the diameter of each through hole 232.

More specifically, the through holes 232 are formed through mechanical drilling, and the number of through holes 232 is equal to or less than the number of coverlay holes 231 in each coverlay 230. When the number of through holes 232 is less than the number of coverlay holes 231 in each coverlay 230, wherever there is a through hole 232, there must be a coverlay hole 231, in other words, wherever a through hole 232 is disposed, a coverlay hole 231 is also correspondingly disposed. The diameter of each coverlay hole 231 is equal to or greater than 3 mm, and the diameter of each through hole 232 is equal to or greater than 1.5 mm. In the embodiment shown in FIG. 3, the number of coverlay holes 231 in each coverlay 230 and the number of through holes 232 are both four, each of the through holes 232 is coaxial with one of the coverlay holes 231 in each coverlay 230, and the diameter of each through hole 232 is 1.5 mm, but the present disclosure is not limited thereby.

Figure 4:
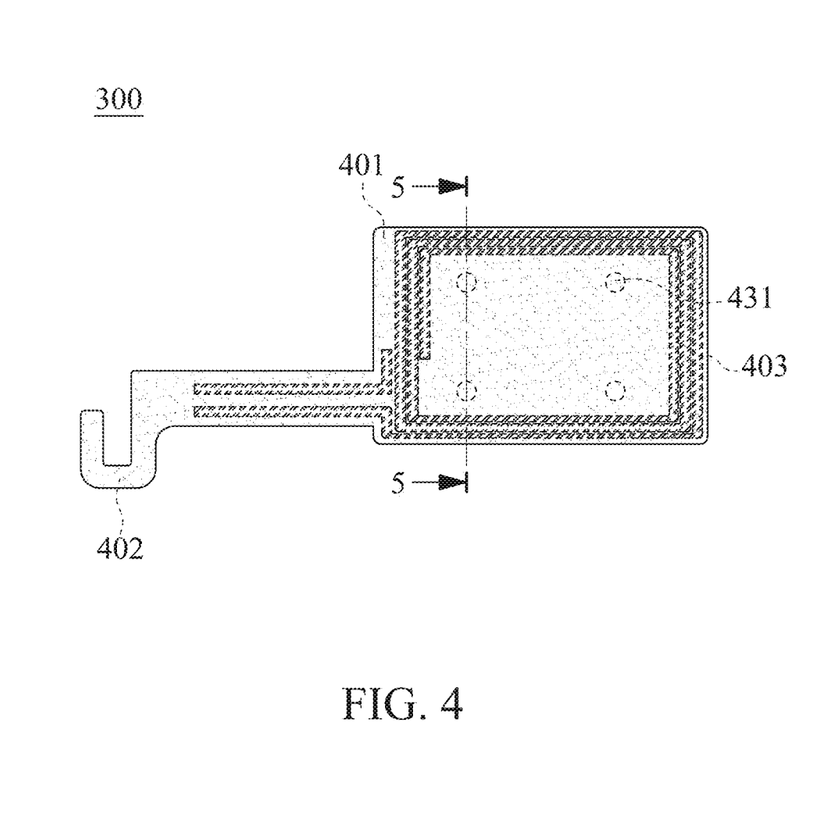
FIG. 4 is a schematic perspective top view of an antenna structure according to one example of another embodiment of the present disclosure.
Figure 5:
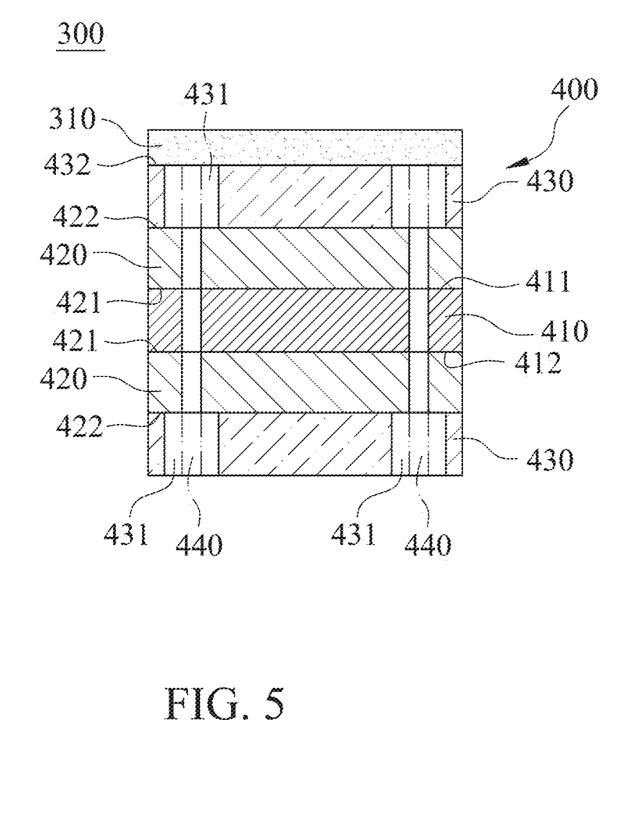
FIG. 5 is a schematic cross-sectional view of the antenna structure along line 5-5 as shown in FIG. 4.

Reference is made to FIG. 4 and FIG. 5, an antenna structure 300 includes a flexible printed circuit 400 and a magnetic layer 310. The flexible printed circuit 400 includes a substrate 410, two copper foil layers 420, two coverlays 430 and at least two through holes 440.

In particular, the flexible printed circuit 400 has a main body part 401 and a bending part 402, and a metal trace 403 is disposed on a surface 432 of the coverlay 430 at the main body part 401. The metal trace 403 is used to connect to an external electronic device and transmit signals, and the metal trace 403 can be in a form of multiple looped coils. The bending part 402 is flexible and is bendable to change shapes. The substrate 410 includes a first surface 411 and a second surface 412. One surface 421 of each of the two copper foil layers 420 is disposed on the first surface 411 and the second surface 412 of the substrate 410, respectively. Each of the two coverlays 430 is disposed on another surface 422 of each of the two copper foil layers 420. Each coverlay 430 includes at least two coverlay holes 431 that penetrate through the coverlay 430 and are disposed inside the metal trace 403 of the main body part 401. The through holes 440 are formed through mechanical drilling and penetrate the substrate 410, the two copper foil layers 420 and the two coverlays 430. Each of the through holes 440 is correspondingly disposed to one of the coverlay holes 431 in each coverlay 430, and the diameter of each coverlay hole 431 is greater than the diameter of each through hole 440. The magnetic layer 310 is attached to the surface 432 of one of the coverlays 430. Thus, through the placement of coverlay holes 431 and through holes 440 in different layers, improvements on the warping of the flexible printed circuit 400 during SMT process is improved as well as the effect on antenna characteristics due to the generation of small bubbles during the attachment of the magnetic layer 310 are achieved.

In the embodiment shown in FIG. 4 and FIG. 5, the substrate 410 is a polyimide substrate, which has better heat resistance, solder resistance, and size stability. Each copper foil layer 420 is disposed on the substrate 410 by lamination, and each coverlay 430 is an ink layer disposed on each copper foil layer 420 by screen printing, spray printing or film lamination to protect the copper foil layer 420 from being exposed and from affecting subsequent processes. In addition, the magnetic layer 310 is made of a magnetic shielding material, such as but not limited to, ferrite layer, for isolating the effect of surrounding magnetic fields.

Further, the coverlay holes 431 of the coverlay 430 above the substrate 410 and the coverlay holes 431 of the coverlay 430 below the substrate 410 are disposed to correspond in position with one another and to be coaxial, or may not be disposed to correspond nor to be coaxial. The number of coverlay holes 431 in each coverlay 430 is equal to or greater than two, and a distance between any two of the coverlay holes 431 is at least greater than 2 mm. The number of through holes 440 is equal to or less than the number of coverlay holes 431 in each coverlay 430, and when the number of through holes 440 is less than the number of coverlay holes 431 in each coverlay 430, wherever there is a through hole 440, there must be a coverlay hole 431, in other words, wherever a through hole 440 is disposed, a coverlay hole 431 is also correspondingly disposed. The diameter of each coverlay hole 431 is equal to or greater than 3 mm, and the diameter of each through hole 440 is equal to or greater than 1.5 mm. None of the coverlay holes 431 and the through holes 440 are electrically conductive, and therefore the effect on antenna performance is minimal. In the embodiment shown in FIG. 4 and FIG. 5, the coverlay holes 431 of the coverlay 430 above the substrate 410 and the coverlay holes 431 of the coverlay 430 below the substrate 410 are disposed to correspond to one another and to be coaxial, the number of coverlay holes 431 in each coverlay 430 and the number of through holes 440 are both four, each of the through holes 440 is coaxially disposed with one of the coverlay holes 431 in each coverlay 430, the smallest distance between two coverlay holes 431 is 2 mm, the diameter of each coverlay hole 431 is 3 mm, and the diameter of each through hole 440 is 1.5 mm, but the present disclosure is not limited thereby.

Figure 6:
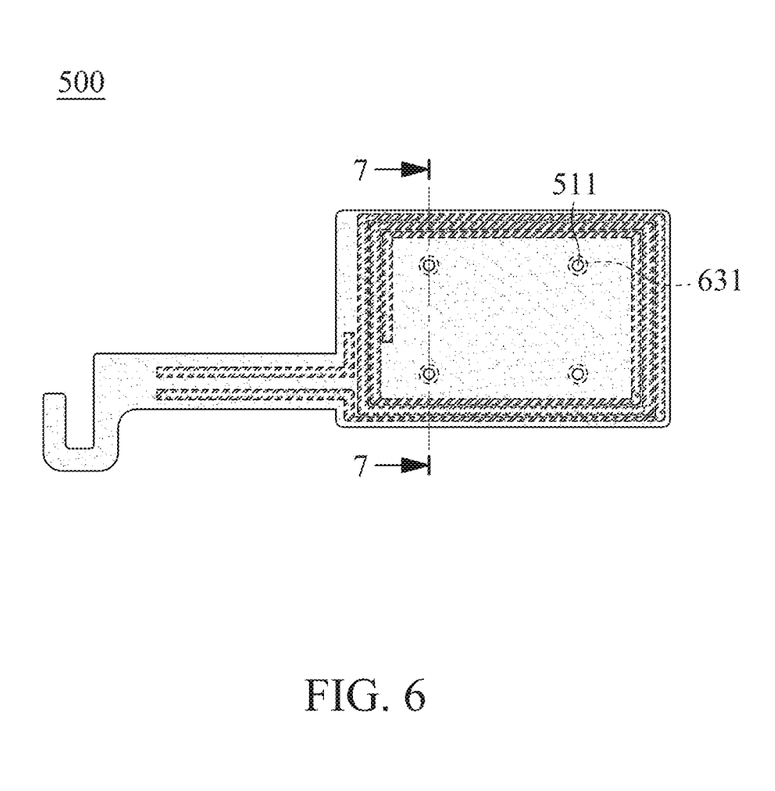
FIG. 6 is a schematic perspective top view of an antenna structure according to another example of another embodiment of the present disclosure.
Figure 7:
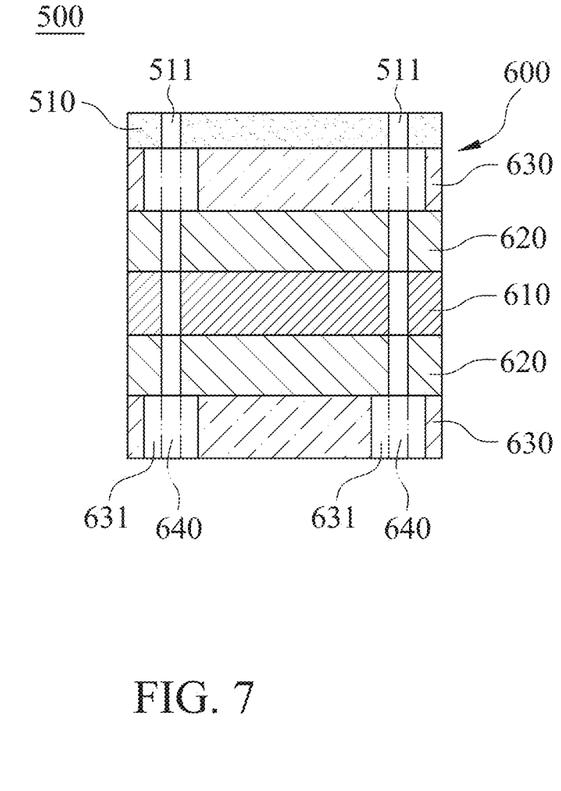
FIG. 7 is a schematic cross-sectional view of the antenna structure along line 7-7 as shown in FIG. 6.

Reference is made to FIG. 6 and FIG. 7, an antenna structure 500 includes a substrate 610, two copper foil layers 620, two coverlays 630, a plurality of through holes 640, a plurality of coverlay holes 631, a magnetic layer 510 and at least two pierced holes 511. The substrate 610, the two copper foil layers 620, the two coverlays 630, the through holes 640, the coverlay holes 631 and the magnetic layer 510 of the antenna structure 500 are similar to that of the antenna structure 300, and will not be described herein. The at least two pierced holes 511 of the antenna structure 500 penetrate through the magnetic layer 510 and are disposed to correspond in position to the through holes 640, respectively.

More particularly, the pierced holes 511 of the magnetic layer 510 and the through holes 640 of the flexible printed circuit 600 are separately formed, and when the magnetic layer 510 is being attached to the flexible printed circuit 600, the pierced holes 511 of the magnetic layer 510 and the through holes 640 of the flexible printed circuit 600 are aligned together for positioning purpose. The number of pierced holes 511 is the same of the number of through holes 640, and the diameter of each pierced hole 511 can be equal to the diameter of each through hole 640 or not, but both of their diameters are smaller than the diameter of the coverlay hole 631. The diameter of each pierced hole 511 is greater than or equal to 1.5 mm. In the embodiment shown in FIG. 6 and FIG. 7, the number of through holes 640 and the number of pierced holes 511 are both four, each of the pierced holes 511 is coaxial with one of the through holes 640, and the diameter of each through hole 640 and the diameter of each pierced hole 511 are both 1.5 mm, but the present disclosure is not limited thereby.

Figure 8:
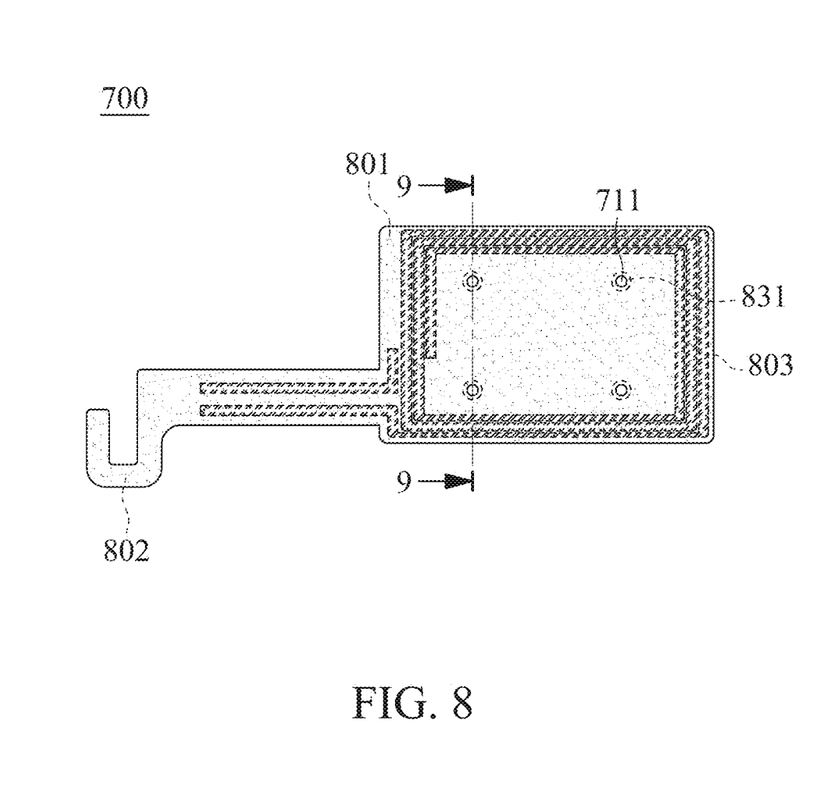
FIG. 8 is a schematic perspective top view of an antenna structure according to one example of further another embodiment of the present disclosure.
Figure 9:
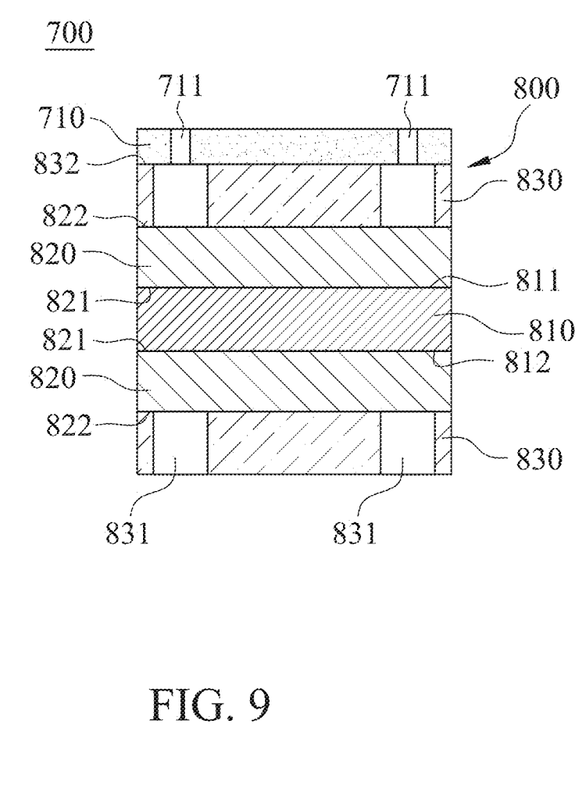
FIG. 9 is a schematic cross-sectional view of the antenna structure along line 9-9 as shown in FIG. 8.

Reference is made to FIG. 8 and FIG. 9, an antenna structure 700 includes a flexible printed circuit 800 and a magnetic layer 710. The flexible printed circuit 800 includes a substrate 810, two copper foil layers 820 and two coverlays 830.

In particular, the flexible printed circuit 800 has a main body part 801 and a bending part 802, and a metal trace 803 is disposed on a surface 832 of the coverlay 830 at the main body part 801. The metal trace 803 is used to connect to an external electronic device and transmit signals, and the metal trace 803 can be in a form of multiple looped coils. The bending part 802 is flexible and is bendable to change shapes. The substrate 810 includes a first surface 811 and a second surface 812. One surface 821 of each of the two copper foil layers 820 is disposed on the first surface 811 and the second surface 812 of the substrate 810, respectively. Each of the two coverlays 830 is disposed on another surface 822 of each of the two copper foil layers 820. Each coverlay 830 includes at least two coverlay holes 831 that penetrate through the coverlay 830 and are disposed inside the metal trace 803 of the main body part 801. The magnetic layer 710 is attached to the surface 832 of one of the coverlays 830 and includes at least two pierced holes 711, and each pierced hole 711 penetrates the magnetic layer 710. Each pierced hole 711 is disposed to correspond in position to one of the coverlay holes 831 in each coverlay 830, and the diameter of each coverlay hole 831 is greater than the diameter of each pierced hole 711. Thus, through the placement of coverlay holes 831 and pierced holes 711 in different layers, improvements on the warping of the flexible printed circuit 800 due to uneven heating during SMT process and the effect on the antenna characteristics due to generation of small bubbles during the attachment of the magnetic layer 710 are achieved.

In the embodiment shown in FIG. 8 and FIG. 9, the substrate 810, the copper foil layers 820, the coverlays 830 and the magnetic layer 710 are similar to that shown in the embodiment of FIG. 4 and FIG. 5, and will not be described herein.

The coverlay holes 831 of the coverlay 830 above the substrate 810 and the coverlay holes 831 of the coverlay 830 below the substrate 810 are disposed to correspond in position with one another and to be coaxial, or may not be disposed to correspond nor to be coaxial. The number of coverlay holes 831 in each coverlay 830 is equal to or greater than two, and a distance between any two of the coverlay holes 831 is at least greater than 2 mm. The number of pierced holes 711 is equal to or less than the number of coverlay holes 831 in each coverlay 830, and when the number of pierced holes 711 is less than the number of coverlay holes 831 in each coverlay 830, wherever there is a pierced hole 711, there must be a coverlay hole 831, in other words, wherever a pierced hole 711 is disposed, a coverlay hole 831 is also correspondingly disposed. The diameter of each coverlay hole 831 is equal to or greater than 3 mm, and the diameter of each pierced hole 711 is equal to or greater than 1.5 mm. None of the coverlay holes 831 and the pierced holes 711 are electrically conductive, and therefore the effect on antenna performance is minimal. In the embodiment shown in FIG. 8 and FIG. 9, the coverlay holes 831 of the coverlay 830 above the substrate 810 and the coverlay holes 831 of the coverlay 830 below the substrate 810 are disposed to correspond to one another and to be coaxial, the number of coverlay holes 831 in each coverlay 830 and the number of pierced holes 711 are both four, each of the pierced holes 711 is coaxial with one of the coverlay holes 831 in each coverlay 830, the smallest distance between two coverlay holes 831 is 2 mm, the diameter of each coverlay hole 831 is 3 mm, and the diameter of each pierced hole 711 is 1.5 mm, but the present disclosure is not limited hereby.

Figure 10A:
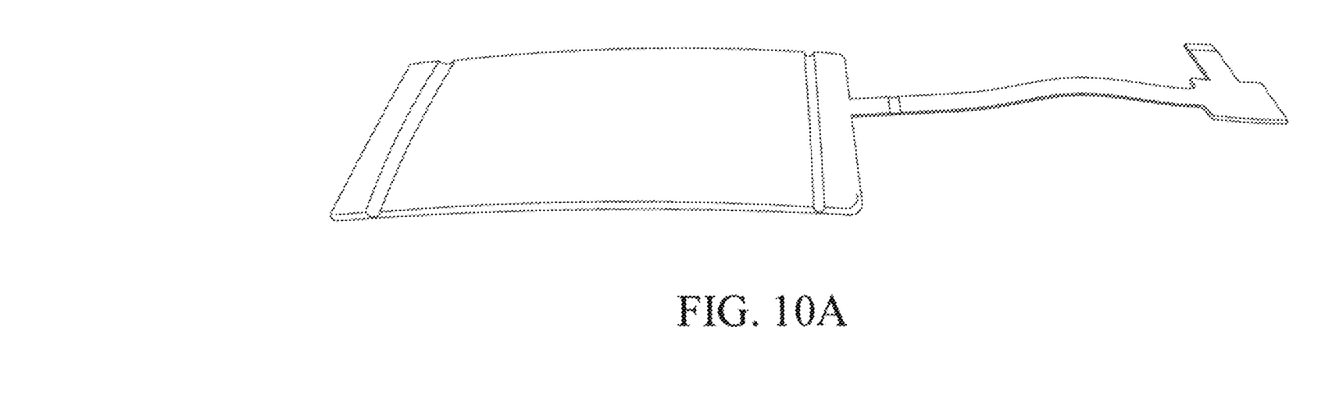
FIG. 10A shows a schematic view of a conventional flexible printed circuit with no coverlay holes.
Figure 10B:
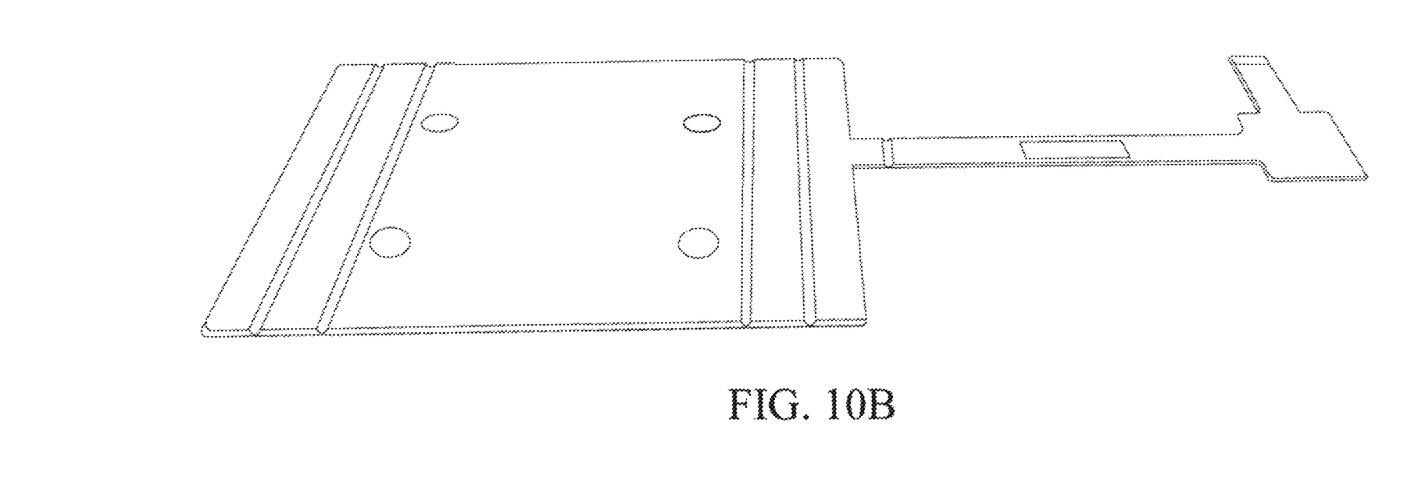
FIG. 10B shows a schematic view of a flexible printed circuit with coverlay holes.

Reference is made to FIG. 10A and FIG. 10B, which respectively show a conventional flexible printed circuit without coverlay holes and a flexible printed circuit with coverlay holes according to the present disclosure, it is clear that the warping of the flexible printed circuit due to uneven heating during SMT process improves dramatically when coverlay holes are disposed in the flexible printed circuit like the present disclosure.

In addition, the antenna structure of the present disclosure is a near field communication (NFC) antenna, where the flexible printed circuit increases the flexibility in designing the antenna structure, and minimizes the space occupied by the antenna structure, which in turn is beneficial for implementation on handheld devices. The attachment process in the manufacturing of the antenna structure according to the present disclosure is described herein.

When the flexible printed circuit does not require to undergo the SMT process, a connected board having a plurality of flexible printed circuits is provided, and the magnetic layers are correspondingly attached to the flexible printed circuits on the connected board by an optical positioning assisted mechanical arm. Each flexible printed circuit with correspondingly attached magnetic layer is then cut and separated from the connected board to form the antenna structure.

When the flexible printed circuit needs to undergo the SMT process, a connected board having a plurality of magnetic layers is provided, and the flexible printed circuit is correspondingly attached to the magnetic layer on the connected board by an optical positioning assisted mechanical arm. Each magnetic layer with correspondingly attached flexible printed circuit is then cut and separated from the connected board to form the antenna structure.

In summary, the present disclosure has the following advantages. First, the warping of the flexible printed circuit due to uneven heating during SMT process is improved through the coverlay holes that penetrate the coverlay. Second, by placing through holes in the flexible printed circuit or pierced holes in the magnetic layer, the formation of bubbles between the flexible printed circuit and the magnetic layer during the attachment process is improved, and the magnetic layer is attached more fitted to the flexible printed circuit for more precise and quick positioning, which in turn enhances product yield and efficiency.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A flexible printed circuit, having a main body part and a bending part, and the flexible printed circuit comprising:
   a substrate comprising a first surface and a second surface;
   two copper foil layers, one surface of each of the two copper foil layers disposed on the first surface and the second surface of the substrate, respectively; and
   two coverlays, each of the two coverlays disposed on another surface of each of the two copper foil layers, and each of the two coverlays comprising:
   at least two coverlay holes disposed on the main body part and penetrating through the coverlay;
   wherein a distance between the at least two coverlay holes in each of the two coverlays is greater than 2 mm.

2. The flexible printed circuit of claim 1, wherein the substrate is a polyimide substrate.

3. The flexible printed circuit of claim 1, wherein each of the two coverlays is an ink layer.

4. The flexible printed circuit of claim 1, further comprising:
   at least two through holes penetrating through the substrate, the two copper foil layers and the two coverlays, wherein each of the at least two through holes is correspondingly disposed to one of the at least two coverlay holes in each of the two coverlays, and a diameter of each of the at least two coverlay holes is greater than a diameter of each of the at least two through holes.

5. The flexible printed circuit of claim 4, wherein the diameter of each of the at least two coverlay holes is equal to or greater than 3 mm, and the diameter of each of the at least two through holes is equal to or greater than 1.5 mm.

6. An antenna structure, comprising:
   a flexible printed circuit having a main body part and a bending part, and the flexible printed circuit comprising:
   a substrate comprising a first surface and a second surface;
   two copper foil layers, one surface of each of the two copper foil layers disposed on the first surface and the second surface of the substrate, respectively;
   two coverlays, each of the two coverlays disposed on another surface of each of the two copper foil layers, and each of the two coverlays comprising:
   at least two coverlay holes disposed on the main body part and penetrating through the coverlay; and
   at least two through holes penetrating through the substrate, the two copper foil layers and the two coverlays, wherein each of the at least two through holes is correspondingly disposed to one of the at least two coverlay holes in each of the two coverlays, and a diameter of each of the at least two coverlay holes is greater than a diameter of each of the at least two through holes; and
   a magnetic layer attached to one surface of one of the two coverlays.

7. The antenna structure of claim 6, wherein the substrate is a polyimide substrate.

8. The antenna structure of claim 6, wherein each of the two coverlays is an ink layer.

9. The antenna structure of claim 6, wherein the magnetic layer is a ferrite layer.

10. The antenna structure of claim 6, wherein a distance between the at least two coverlay holes in each of the two coverlays is greater than 2 mm.

11. The antenna structure of claim 10, further comprising:
at least two pierced holes penetrating through the magnetic layer, wherein each of the at least two pierced holes is correspondingly disposed to each of the at least two through holes.

12. The antenna structure of claim 11, wherein a diameter of each of the at least two pierced holes is equal to the diameter of each of the at least two through holes.

13. The antenna structure of claim 11, wherein the diameter of each of the at least two coverlay holes is equal to or greater than 3 mm, and the diameter of each of the at least two through holes and a diameter of each of the at least two pierced holes are equal to or greater than 1.5 mm.

14. An antenna structure, comprising:
a flexible printed circuit having a main body part and a bending part, and the flexible printed circuit comprising:
a substrate comprising a first surface and a second surface;
two copper foil layers, one surface of each of the two copper foil layers disposed on the first surface and the second surface of the substrate, respectively; and
two coverlays, each of the two coverlays disposed on another surface of each of the two copper foil layers, and each of the two coverlays comprising:
at least two coverlay holes disposed on the main body part and penetrating through the coverlay; and
a magnetic layer attached to one surface of one of the two coverlays and comprising at least two pierced holes, and each of the at least two pierced holes penetrating through the magnetic layer;
wherein each of the at least two pierced holes is correspondingly disposed to one of the at least two coverlay holes in each of the two coverlays, and a diameter of each of the at least two coverlay holes is greater than a diameter of each of the at least two pierced holes.

15. The antenna structure of claim 14, wherein the substrate is a polyimide substrate.

16. The antenna structure of claim 14, wherein each of the two coverlays is an ink layer.

17. The antenna structure of claim 14, wherein the magnetic layer is a ferrite layer.

18. The antenna structure of claim 14, wherein a distance between the at least two coverlay holes in each of the two coverlays is greater than 2 mm.

19. The antenna structure of claim 18, wherein the diameter of each of the at least two coverlay holes is equal to or greater than 3 mm, and the diameter of each of the at least two pierced holes is equal to or greater than 1.5 mm.

* * * * *